(12) United States Patent
de Haas (10) Patent No.: US 11,616,861 B1
(45) Date of Patent: Mar. 28, 2023

(54) SYMMETRY RECEIVING DIFFERENTIAL MANCHESTER ENCODING

(71) Applicant: NXP B.V., Eindhoven (NL)

(72) Inventor: Clemens Gerhardus Johannes de Haas, Ewijk (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/489,362

(22) Filed: Sep. 29, 2021

(51) Int. Cl.
*H04L 69/00* (2022.01)
*H03M 5/12* (2006.01)

(52) U.S. Cl.
CPC .............. *H04L 69/03* (2013.01); *H03M 5/12* (2013.01)

(58) Field of Classification Search
CPC ................................. H04L 69/03; H03M 5/12
See application file for complete search history.

(56) References Cited

U.S. PATENT DOCUMENTS

| | | | |
|---|---|---|---|
| 4,007,329 A | 2/1977 | McClain et al. | |
| 6,664,821 B2 | 12/2003 | De Haas et al. | |
| 9,571,308 B1 * | 2/2017 | Lugthart | H03M 5/12 |
| 2010/0110939 A1 * | 5/2010 | Fukuda | H03M 5/12 |
| | | | 375/295 |
| 2019/0230705 A1 | 7/2019 | Beruto et al. | |
| 2021/0183173 A1 | 6/2021 | Mizrahi | |
| 2021/0266205 A1 | 8/2021 | Michaeli et al. | |
| 2021/0267101 A1 | 8/2021 | Huang et al. | |
| 2021/0286748 A1 | 9/2021 | Brychta et al. | |

OTHER PUBLICATIONS

Gergely Huszak et al., Backward-compatible forward error correction of burst errors and erasures for 10BASE-T1S, IEICE Transactions on Communications, Jun. 23, 2021.
Tim Baggett et al., OPEN Alliance, 10BASE-T1x MACPHY Serial Interface, Sep. 14, 2020.
Yu Yu et al; "Pulse-Width Tunable and Regenerative Multi-Channel NRZ to RZ Conversion with Duplicate Output", Communications and Photonics Conference and Exhibition, IEEE Piscataway, NJ, US; 2 pages (Dec. 8, 2010).

* cited by examiner

*Primary Examiner* — Janice N Tieu (57) ABSTRACT

A 10BASE-T1S PHY method and apparatus are provided for receiving an analog MDI signal conveying DME-encoded data at a receiver comparator to generate a digital output signal, processing the digital output signal using a pulse encoder to generate a pulse-coded output signal with pulses generated at each rising or falling transition in the digital output signal, processing the pulse-coded output signal with an output driver to generate a pulse-coded driver output signal that is transmitted to a receiver interface pin RX, processing the pulse-coded driver output signal with an input comparator to generate a pulse-coded comparator output signal, processing the pulse-coded comparator output signal using a pulse decoder to generate a DME-encoded PMA input signal in which timing asymmetries caused by processing at the receiver comparator and/or output driver have been eliminated, and then processing DME-encoded PMA input signal at a digital PHY circuit in the Ethernet PHY.

20 Claims, 9 Drawing Sheets

SYMMETRY RECEIVING DIFFERENTIAL MANCHESTER ENCODING

BACKGROUND OF THE INVENTION

Field of the Invention

The present invention is directed in general to electronic data communication channel circuits, methods, and systems. In one aspect, the present invention relates to OPEN Alliance TC14 communication interfaces between a 10BASE-T1S transceiver and a 10BASE-T1S digital PHY.

Description of the Related Art

Ethernet and Internet Protocol (IP)-based networks are used extensively in computer networks, such as automotive, IoT and all kinds of automation applications. For example, autonomous cars and other vehicles include computer networks that generate, process, and exchange high volumes of data, sometimes on the order of Terabytes, in the course of a day of driving. The sources of data in an autonomous car may include cameras and other sensors, Advanced Driver-Assistance Systems (ADAS), Telematics Control Units (TCU), Infotainment systems, as well as various Electronics Control Units (ECUs). To secure high data throughput over Ethernet links in such high data volume computer networks, the IEEE Std 802.3cg standard defines a 10 Mbps Ethernet PHY (10BASE-T1S) that offers a bandwidth of 10 Mbit/ for short reach applications, such as automotive or in-system networks, over a single unshielded twisted pair (UTP) cable. The defined 10BASE-T1S PHY maintains a data rate of 10 Mb/s at MAC/PHY interface by using 4B/5B mapping over Differential Manchester Encoded data at the MDI bus, while internal receive data transmitted from the analog PHY portion to the digital PHY portion is encoded with plain non-return-to-zero (NRZ) coding. However, the internal PHY circuitry that processes the receive data can cause timing delays or asymmetries that reduce the amount of time available for Physical Medium Attachment (PMA) sampling at the digital PHY. While solutions have been proposed for reducing or eliminating timing delays or asymmetries at the internal receive data, existing solutions have a number of performance drawbacks and design limitations and are extremely difficult at a practical level in terms of providing sufficient timing margin for PMA sampling and/or for other contributors, like clock speed/tolerance and differential noise on the bus.

BRIEF DESCRIPTION OF THE DRAWINGS

The present invention may be understood, and its numerous objects, features and advantages obtained, when the following detailed description is considered in conjunction with the following drawings.

DETAILED DESCRIPTION

A receive pin signal interface circuit, design, and methodology are described for pulse coding the RX pin data at the interface between a 10BASE-T1S transceiver circuit and a 10BASE-T1S digital PHY circuit. As disclosed herein, the pulse coding of the RX pin data at the receive pin signal interface is implemented by employing a return-to-zero (RTZ) coding scheme where each rising or falling transition on the MDI bus generates an RTZ pulse. In selected embodiments, the pulse encoding scheme uses an RTZ pulse encoder to process or encode the output of the receiver comparator at the transceiver circuit before driving the RX pin. In addition, the pulse encoding scheme uses an RTZ pulse decoder to process or decode the logic output of the RX input circuit back to a level scheme before being provided to the digital PHY circuit. By using RTZ pulse coding/decoding at the receive pin signal interface to capture transitions on the MDI bus signal, timing asymmetries caused by the RX driver of the transceiver circuit and/or the RX input circuit of the digital PHY circuit may be eliminated, thereby providing more time margin for the PMA sampling and/or for other contributors, like clock speed/tolerance and differential noise on the bus.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified schematic circuit block diagrams without including every circuit element or detail in order to avoid limiting or obscuring the present invention. Such descriptions and representations are used by those skilled in the art to describe and convey the substance of their work to others skilled in the art. It is also noted that, throughout this detailed description, certain elements in the figures are illustrated for simplicity and clarity and have not necessarily been drawn to illustrate specific details. Furthermore, the described features, advantages, and characteristics of the invention may be combined in any suitable manner in one or more embodiments. One skilled in the relevant art will recognize, in light of the description herein, that the embodiments can be practiced without one or more of the specific features or advantages of a particular embodiment. In other instances, additional features and advantages may be recognized in certain embodiments that may not be present in all embodiments. For example, selected aspects are depicted with reference to simplified circuit schematic drawings without including every circuit detail in order to avoid limiting or obscuring the present invention. Such details are well known and not considered necessary to teach one skilled in the art of how to make or use the present invention.

Figure 1:
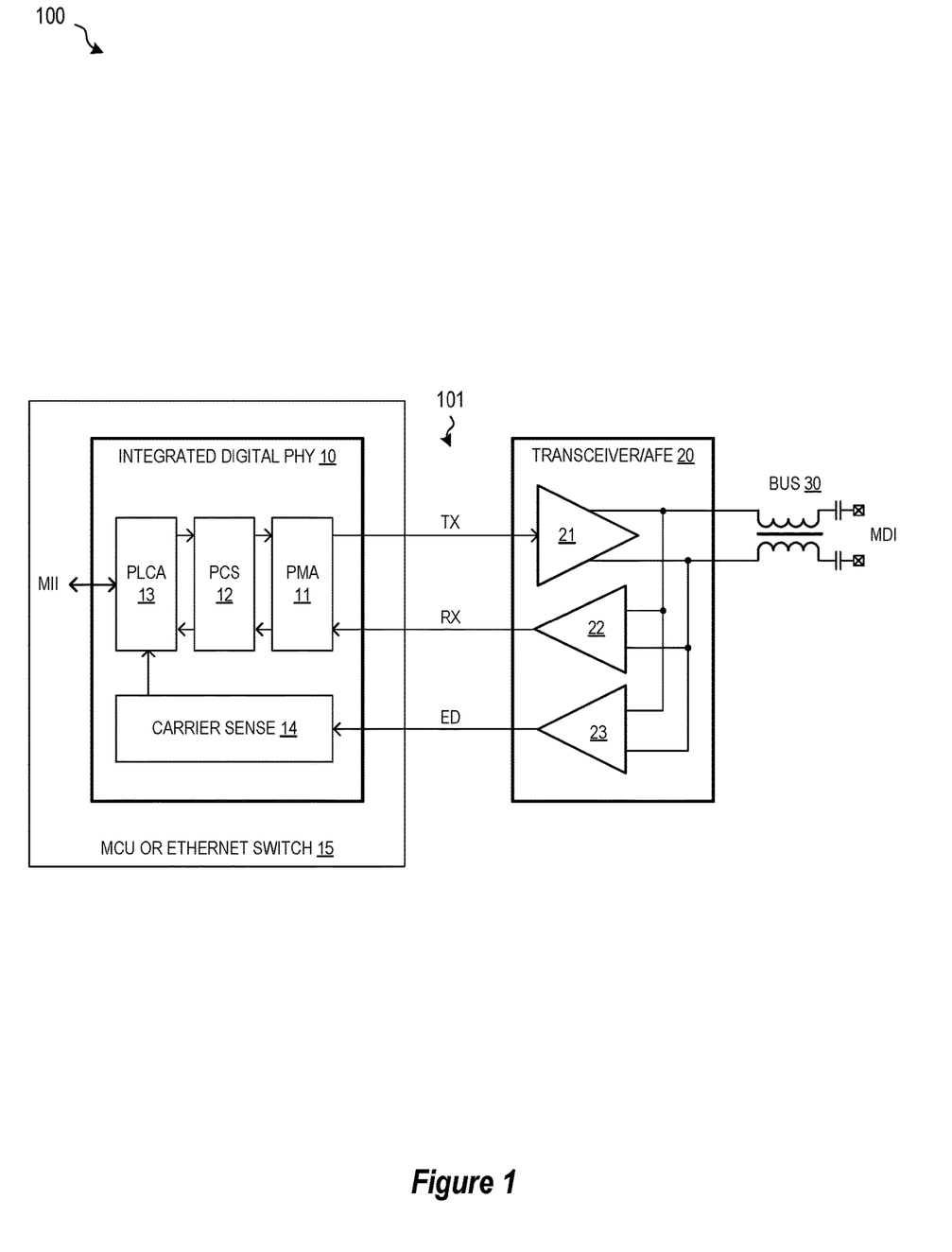
FIG. 1 illustrates a high-level block diagram of an interface between an analog transceiver PHY device and digital PHY device in accordance with a 10BASE-T1S PHY defined by the IEEE 802.3cg standard.

As indicated above, the IEEE 802.3cg project has been developed to secure high data throughput over Ethernet links by defining a 10 Mbps Ethernet PHY (10BASE-T1S) that offers a bandwidth of 10 Mbit/ for short reach applications, such as automotive or in-system networks, over a single unshielded twisted pair (UTP) cable. In connection with the IEEE 802.3cg standard (Clause 147), a 10 Mbps Ethernet PHY (10BASE-T1S) is defined for short reach applications, such as automotive or in-system networks, to operate in full/half duplex point-to-point or half-duplex multidrop mode over a short reach single unshielded twisted pair (UTP) cable. As illustrated in FIG. 1, the 10BASE-T1S PHY 100 includes a digital PHY portion 10 and an analog PHY portion 20 which are connected over a simple and cost effective 3-pin clockless interface 101 which includes transmit interface pin TX, a receive interface pin RX, and an energy detect interface pin ED. As illustrated, the digital PHY portion 10 may be integrated with a first CMOS integrated circuit (IC) as part of the MCU or Ethernet switch 15 which is connected over a Media Access Control (MAC) unit to the host controller (not shown), while the analog PHY portion 20 may be integrated in a separate transceiver or analog front end (AFE) IC 20. In the digital PHY portion 10, the Physical Medium Attachment (PMA) unit 11 contains the functions for transmission, reception, collision detection, clock recovery, and skew alignment. Above the PMA 11, the Physical Coding Sublayer (PCS) unit 12 contains the functions to encode data bits for transmission via the PMA and to decode the received conditioned signal from the PMA 11. Finally, the Physical Layer Collision Avoidance (PLCA) unit 13 provides packet fairness, bounded and calculable channel access delay, and effective throughput to the Media-Independent Interface (MII) as specified in Clause 148 of IEEE Std 802.3cg-2019. In the analog PHY portion 20, a first transmitter 21 may be embodied as a digital-to-analog converter (DAC) and line driver circuit to convert data from the transmit interface pin TX for transmission over the medium dependent interface (MDI) bus 30. In addition, the analog PHY portion 20 includes a first receiver comparator 22 that may include an analog-to-digital converter (ADC) to convert received data from the MDI bus 30 for transmission over the receive interface pin RX to the digital PHY portion 10. The analog PHY portion 20 also includes a second receiver comparator 23 that is configured to assert a signal at the energy detect interface pin ED as soon as activity is detected in the data stream received on the MDI bus 30.

Currently, the OPEN Alliance TC14 standard specifies that data transmitted on the MDI bus 30 is coded with Differential Manchester Encoding (DME), while plain non-return-to-zero (NRZ) coding is to be used on the receive interface pin RX to the digital PHY portion 10. To illustrate the different encoding approaches, reference is now made to FIG. 2 which illustrates 10BASE-T1S signals 200 for the interfacing between a transceiver 20 and integrated digital PHY 10 as currently specified in the OPEN Alliance TC14 specification, including the MDI bus signal 201, along with the corresponding receive interface pin RX signal 202 and the PMA decode signal 203. As illustrated, the DME-encoded MDI bus signal 201 includes differential voltage levels in which the typical voltage levels are between +500 mV and −500 mV for a typical receiver threshold of 0V. With a specified bit time duration (e.g., typically 80 ns), a "Data 1" value is coded with a transition in the middle (40 ns) of the bit time, while a "Data 0" is coded without a transition in the middle of the bit time. As a result, the DME-encoded receive data at the MDI bus is polarity insensitive because the data is coded with transitions, and not with levels. As shown with the solid line in the receive interface pin RX signal 202, the output of a receiving comparator 22 drives the receive interface pin RX "high" (when the MDI bus voltage is above 0 V) and "low" (when the MDI bus voltage is below 0 V). Within each rising or falling transition in the MDI bus signal 201, an NRZ coding scheme is applied so that the receive interface pin RX signal 202 generates a corresponding rising or falling pulse transition. As a result, each pulse in the receive interface pin RX signal 202 generally corresponds to a paired rising and trailing edge in the MDI bus signal 201. And as shown with the PMA decode signal 203, the PMA responds to the receive interface pin RX signal 202 by performing clock recovery to track the edges at the bit boundaries (clock edges repeating each 80 ns) on the RX pin. The PMA decoded data is represented with the edge in the middle of the bit, where a "DATA=1" value is indicated when there is an edge or transition present, and a "DATA=0" value is indicated when there is NOT an edge or transition present (e.g., a missing edge). In an example implementation, the PMA unit 11 decodes the data by sampling the receive interface pin RX with a specified delay ($t_{SAMPLE}$) after detecting a clock edge for each specified bit time.

Figure 2:
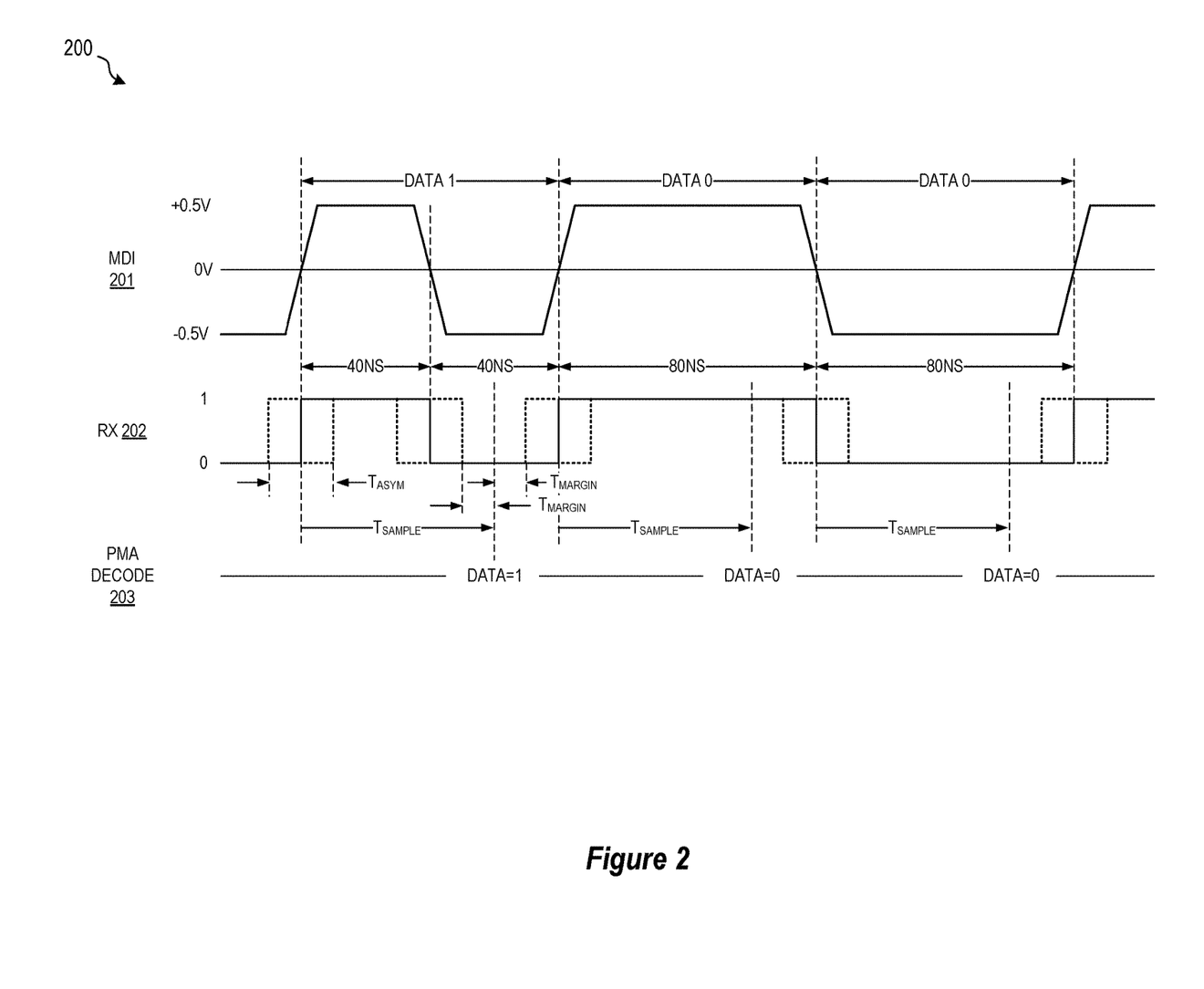
FIG. 2 illustrates a plurality of receive signal waveforms for a 10BASE-T1S PHY, including an MDI bus signal, receive pin bus signal, and PMA decode signal.

Due to a variety of factors, the pulse width of the RX signal 202 can vary, as indicated with the dashed lines in the receive interface pin RX signal 202. Examples of factors that can induce variations in the pulse width of the RX signal 202 can include, for example, noise superimposed on the MDI bus due to EMI (Electro Magnetic Immunity) and/or asymmetry of the transceiver 20 and the digital PHY 10. Furthermore, the printed circuit board wiring between transceiver 20 and MCU/Switch 15 may have impact on the signal timings.

As a result of variations in the pulse width of the receive interface pin RX signal 202, timing differences can arise between the rising and falling edge and potential glitching on edges, such as illustrated with the timing difference ($t_{ASYM}$). Since the PMA unit decodes the RX data by sampling the receive interface pin RX at a specified delay ($t_{SAMPLE}$) after detecting a clock edge at the MDI signal 201, the timing differences or asymmetries can effectively reduce the available timing margin ($t_{MARGIN}$) for the PMA unit to decode the receive interface pin RX signal 202.

Figure 3:
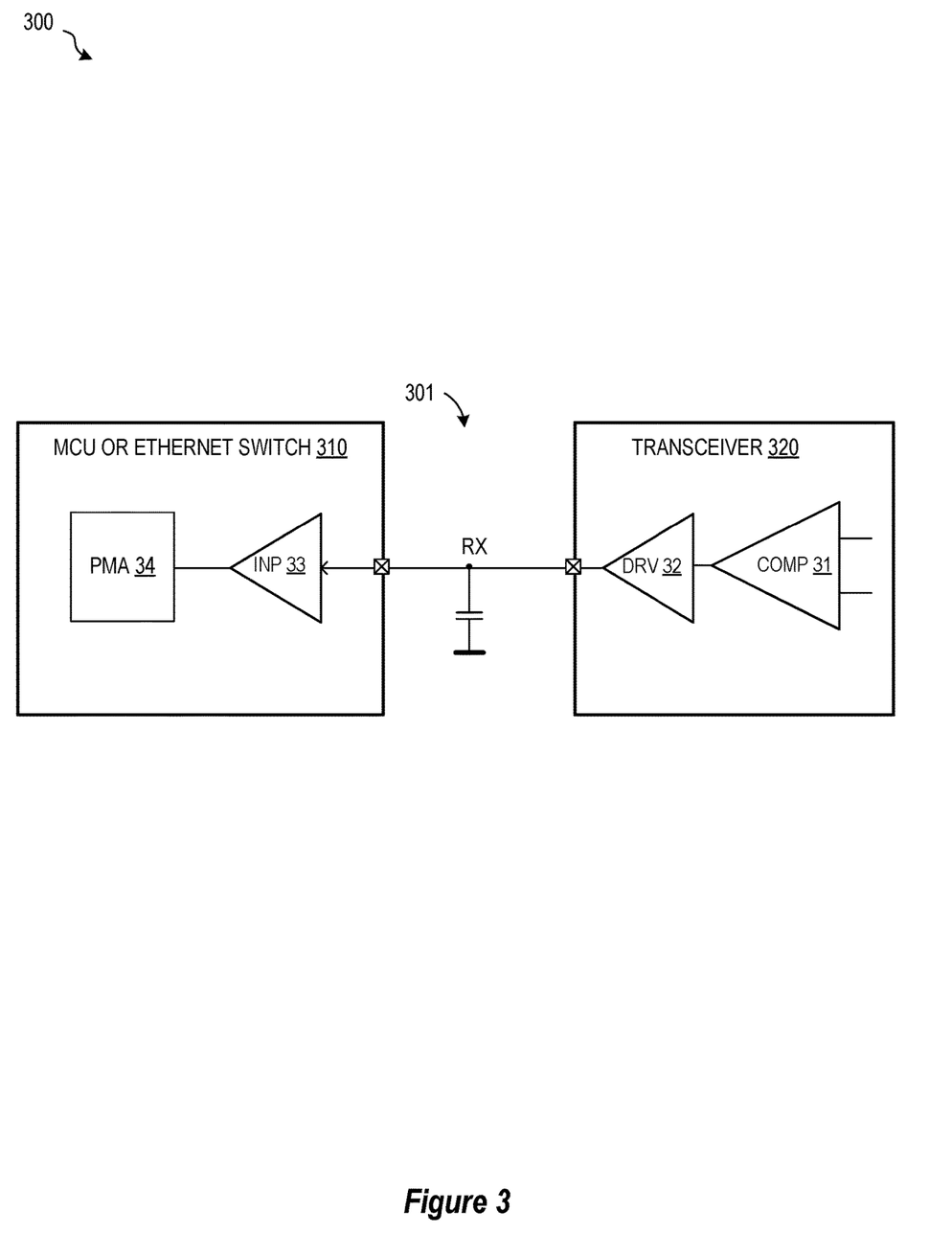
FIG. 3 illustrates a high-level block diagram of an receive interface between an output driver of an analog transceiver PHY device and an input comparator of a digital PHY device.

For an improved understanding of existing solutions for addressing timing asymmetries at the RX pin interface, reference is now made to FIG. 3 which illustrates a high-level block diagram 300 of an receive interface 301 between an analog transceiver PHY device 320 and a digital PHY device 310. As illustrated, the analog transceiver PHY device 320 includes a receiving comparator 31 which is connected over an output driver 32 to drive the RX pin. In this way, the output driver 32 can generate faster transitions on the RX pin. In similar fashion, the digital PHY 310 includes an input comparator or driver 33 connected to the RX pin to drive the input to the PMA 34. As will be appreciated, the output driver 34 for the RX pin in the transceiver 320 will typically have different propagation delays for the rising and falling edges. For example, if the output driver 34 uses a CMOS buffer to drive the RX pin, the different characteristics of the PMOS and NMOS transistors in the CMOS buffer will result in different rising and falling slopes. By the same token, the input comparator/driver 33 for the RX pin can have different propagation delays for the rising and falling edges, such as when the threshold of the comparator 33 is not exactly half the supply voltage.

Figure 4A:
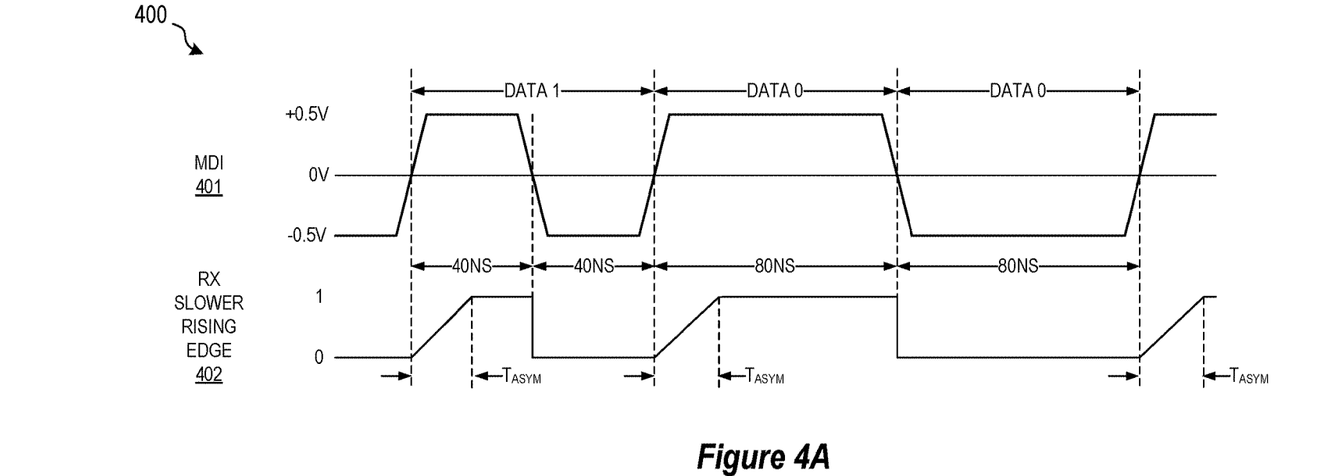
FIG. 4A illustrates a plurality of receive signal waveforms for a 10BASE-T1S PHY, including an MDI bus signal and a receive pin bus signal having slower rising edges which create timing asymmetries between an output driver of an analog transceiver PHY device and an input comparator of a digital PHY device.
Figure 4B:
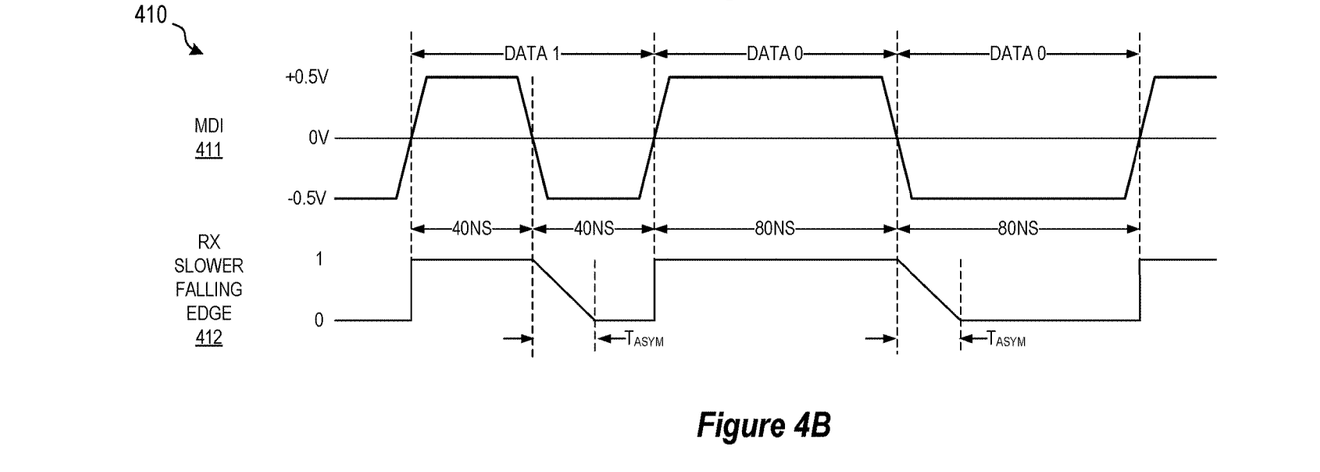
FIG. 4B illustrates a plurality of receive signal waveforms for a 10BASE-T1S PHY, including an MDI bus signal and a receive pin bus signal having slower falling edges which create timing asymmetries between an output driver of an analog transceiver PHY device and an input comparator of a digital PHY device.

To illustrate the timing asymmetries that result from differences in the rising and falling edges caused by the design of the output driver 32 and input comparator/driver 33 at the NRZ-encoded RX pin, reference is now made to FIG. 4A which illustrates a plurality of receive signal waveforms 400 for a 10BASE-T1S PHY, including an MDI bus signal 401 and a receive pin bus signal 402 which has rising edges that are slower than the falling edges. As illustrated, the slower rising edges at the RX pin 402 create a timing asymmetry ($t_{ASYM}$) which extends from each rising edge of the MDI bus signal 401, thereby reducing the timing margin available for PMA decoding. In similar fashion, FIG. 4B illustrates receive signal waveforms 410 which include the MDI bus signal 411 and receive pin bus signal 412 for a 10BASE-T1S PHY where the receive pin bus signal 412 has falling edges that are slower than the rising edges, thereby creating a timing asymmetry ($t_{ASYM}$) which extends from each falling edge MDI bus signal 401 to reduce the available timing margin.

One approach to compensate for the tighter timing margins caused by timing asymmetries at the NRZ-encoded RX pin may include requiring tighter tolerances on the sampling clock, but this solution can increase the complexity and cost of the PHY device. For example, requiring fast input pins on the microcontroller unit will limit which type of GPIO (General Purpose Input Output) that can be used to interface with the 10BASE-T1S transceiver, resulting in less flexibility in the application of the MCU. Another solution for reducing or eliminating timing delays or asymmetries include using fast slopes on the MDI bus signal, but this has its own performance drawbacks and design limitations. For example, fast edges on the MDI bus signal can generate large electro-magnetic emissions (EMEs) which exceed EME requirements. As a result, the existing solutions for reducing or eliminating timing asymmetries are extremely difficult at a practical level in terms of providing sufficient timing margin for PMA sampling and/or for other contributors, like clock speed/tolerance and differential noise on the bus.

Figure 5:
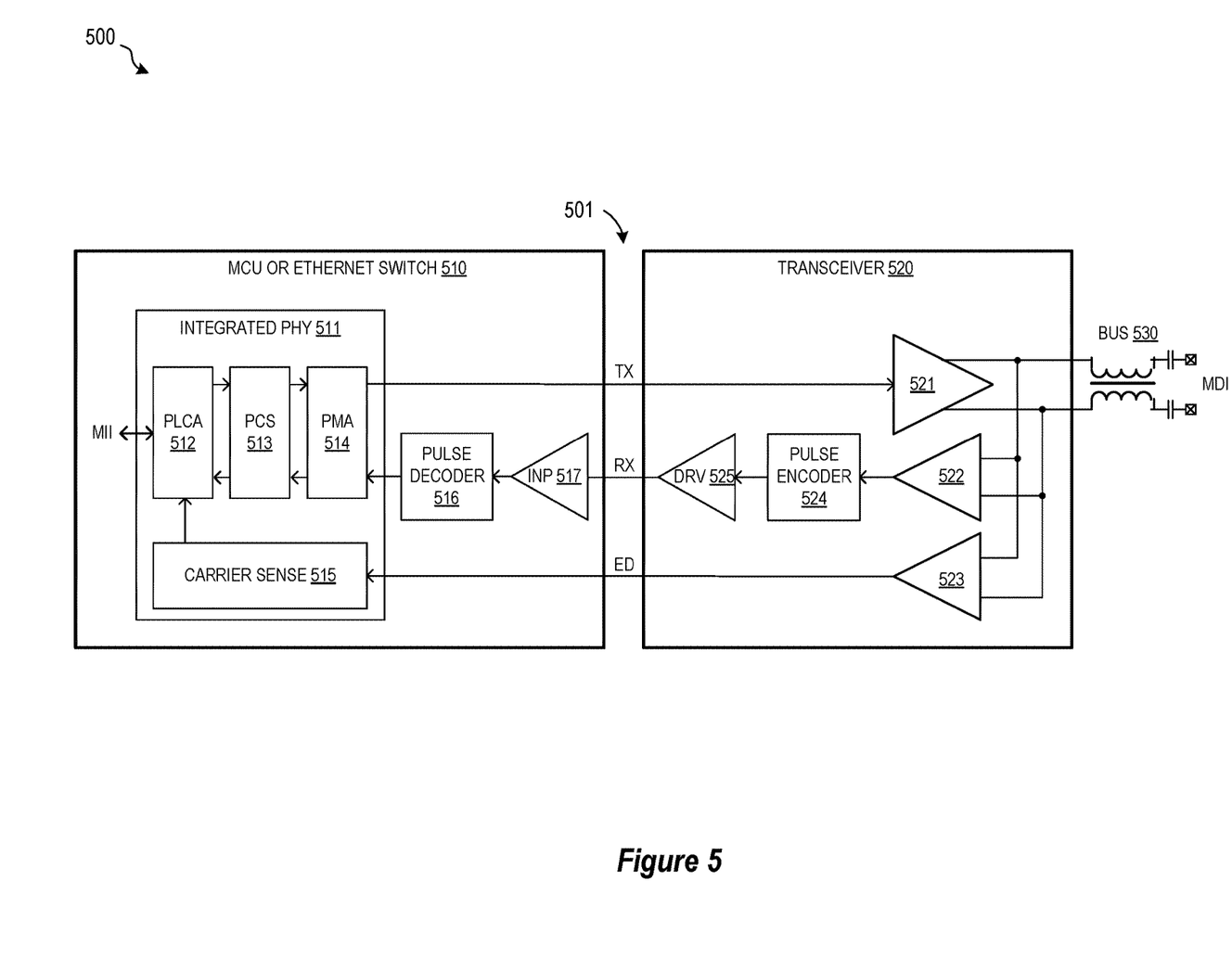
FIG. 5 illustrates a high-level block diagram of a receive interface between an analog transceiver PHY device and digital PHY device wherein pulse encoding/decoding is applied to the receive pin data in accordance with selected embodiments of the present disclosure.

To address these timing asymmetry deficiencies and others resulting from NRZ-encoded RX pin data, selected embodiments of the present disclosure provide a pulse encoding/decoding scheme at the RX pin interface between a 10BASE-T1S transceiver circuit and a 10BASE-T1S digital PHY circuit. An example embodiment of the RX pin interface pulse encoding/decoding scheme is illustrated in FIG. 5 which depicts a high-level block diagram of a 10BASE-T1S PHY 500 wherein an analog transceiver PHY device 520 is connected to process data received from the MDI bus 530, and to transmit the received data over an interface 501 to a digital PHY device 511. As illustrated, the digital PHY portion 511 may be integrated with an MCU or Ethernet switch or integrated circuit 510, while the analog transceiver PHY device 520 may be integrated in a separate analog front end (AFE) IC. In the digital PHY device 511, the PMA unit 514 provides the physical medium attachment functions for transmission, reception, collision detection, clock recovery, and skew alignment. In addition, the PCS unit 513 provides the physical coding sublayer functions to encode data bits for transmission via the PMA 514 and to decode the received conditioned signal from the PMA 514. Finally, the PLCA unit 512 provides the physical layer collision avoidance functions to implement packet fairness, bounded and calculable channel access delay, and effective throughput to the Media-Independent Interface (MII). In the analog transceiver PHY device 520, a first transmitter 521 is provided to convert data from the transmit interface pin TX for transmission over the medium dependent interface (MDI) bus 530. The analog transceiver PHY device 520 also includes a receiver comparator 523 that is configured to assert a signal at the energy detect interface pin ED as soon as activity is detected in the data stream received on the MDI bus 530. In addition, the analog transceiver PHY device 520 includes a receiver comparator 522 that is provided to convert received data from the MDI bus 530 for transmission over the receive interface pin RX to the digital PHY portion 511. However, instead of transmitting NRZ-encoded data over the RX pin, the analog transceiver PHY device 520 includes a pulse encoder 524 at the input of the output driver 525 of transceiver 520 which converts the signal levels on the MDI bus to a return-to-zero (RTZ) encoded signal at the RX pin. And at the digital PHY device 511, a pulse decoder 516 is included at the output of the input comparator/driver 517 which converts the RTZ-encoded signal received from the RX pin back to a level scheme for processing by the digital PHY.

Figure 6:
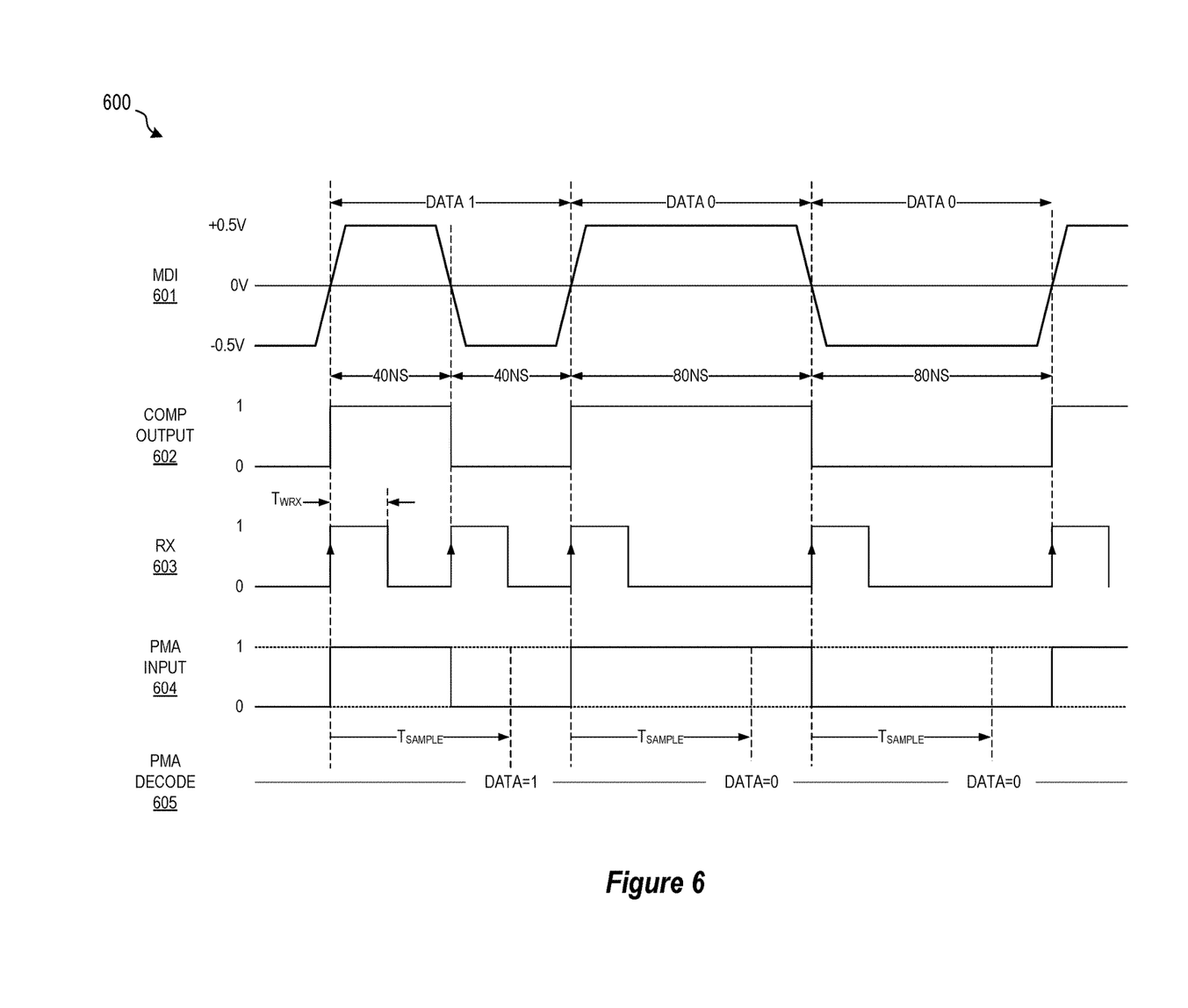
FIG. 6 illustrates a plurality of receive signal waveforms for a 10BASE-T1S PHY wherein pulse encoding/decoding is applied to the receive pin data in accordance with selected embodiments of the present disclosure.

By using RTZ pulse coding at the receive pin signal interface, timing asymmetries caused by the RX driver of the transceiver circuit and/or the RX input circuit of the digital PHY circuit may be eliminated, thereby providing more time margin for the PMA sampling and/or for other contributors, like clock speed/tolerance and differential noise on the bus. To illustrate the timing benefits of using RTZ pulse coding at the receive pin signal interface with reference to the example 10BASE-T1S PHY 500 shown in FIG. 5, reference is now made to FIG. 6 which depicts a plurality of 10BASE-T1S PHY receive signal waveforms 600. As illustrated, the MDI bus signal 601 depicts the DME-encoded signal received at the MDI bus 503, where the differential voltage levels switch between first and second voltage levels (e.g., +500 mV and −500 mV) to code, within each specified bit time duration (e.g., typically 80 ns) a "Data 1" value with a transition in the middle (40 ns) of the bit time, or a "Data 0"

without a transition in the middle of the bit time. In addition, the comparator output signal 602 depicts the output of the receiving comparator 522 which is driven "high" (when the MDI bus voltage is above 0 V) and "low" (when the MDI bus voltage is below 0 V). And as shown with the RX signal 603, the pulse encoder 524 responds to each transition on the comparator output signal 602 by generating a positive pulse on the RX signal 603 having a fixed width or duration of $t_{WRX}$. As a result, the pulse encoder 524 generates an RTZ-encoded signal at the RX pin 603, thereby removing any timing asymmetries from the comparator output 602. Subsequently, the received RX signal 603 is processed with the RX input circuitry 517 and then decoded with the pulse decoder 516 to generate the DME-encoded PMA input signal. As illustrated with the PMA input signal 604, the pulse decoder 516 changes its output level only when a rising edge is detected on the RX pin 603 before transmitting the pulse decoded signal to the PMA 512 which will decode the DME-encoded PMA input signal.

As disclosed herein, there is no critical duration of the pulse widths ($t_{WRX}$) at the RX signal 603. However, since the shortest bit time in case of 10BASE-T1S is 40 ns (typical without spread of clock and system asymmetry), the pulse duration $t_{WRX}$ in the RX signal 603 should have a maximum duration so that the RTZ-encoded RX signal 603 returns to the LOW value before the next possible transition on the MDI bus 601 and comparator output 602. For example, the maximum duration of the pulse width would be $t_{WRX}$=20 ns upon assuming a typical bit time of 40 ns and subtracting a jitter requirement of 15 ns and subtracting a minimum low level of 5 ns. In addition, the duration $t_{WRX}$ should have a minimum duration (e.g., 5 ns) that is sufficient for the RX driver 525 and RX input circuitry 517 to detect the pulses in the RX signal 603.

Figure 7:
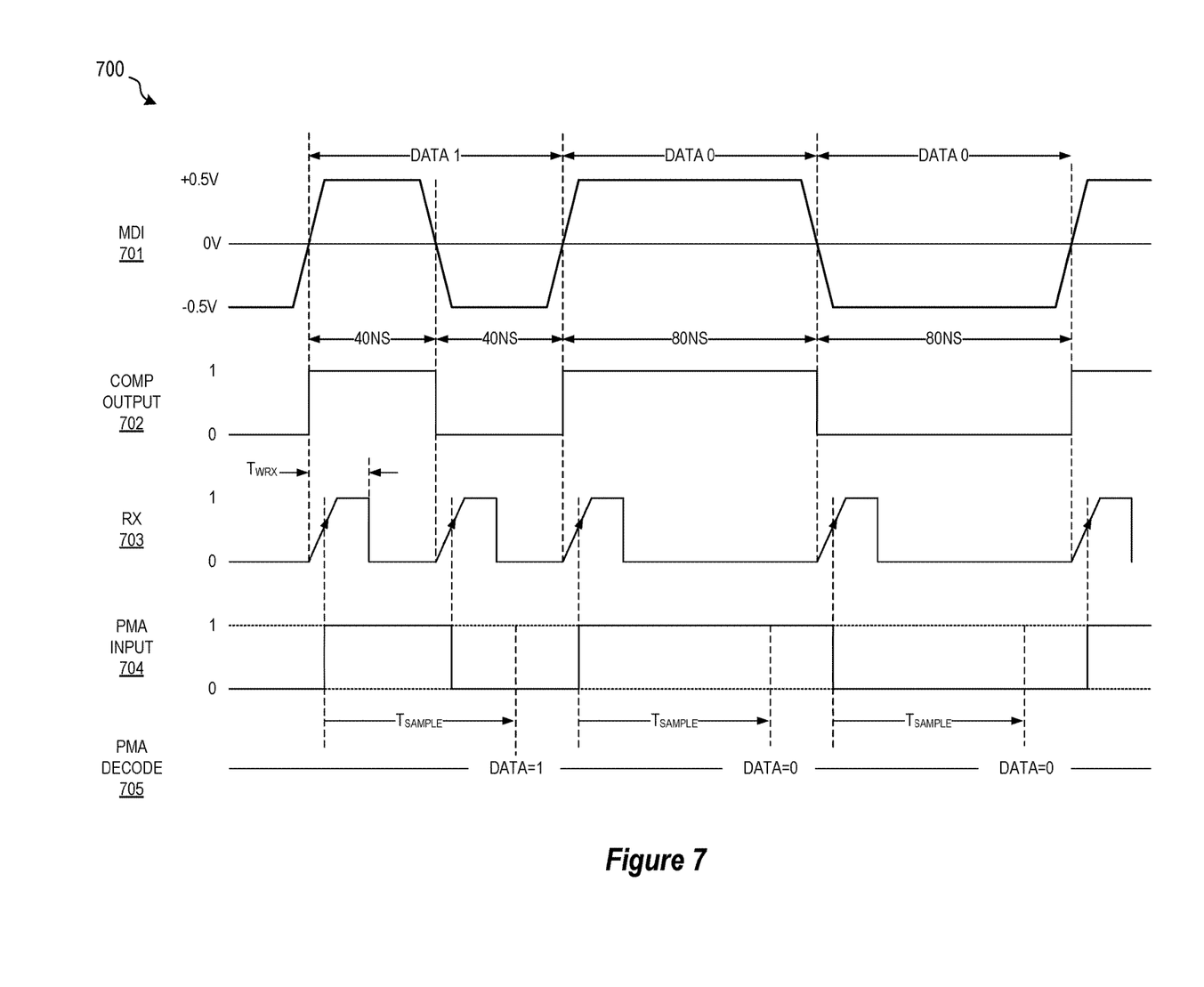
FIG. 7 illustrates a plurality of receive signal waveforms for a 10BASE-T1S PHY wherein pulse encoding/decoding is applied to the receive pin data when the RX driver in the transceiver has a large asymmetry between the rising and falling edge in accordance with selected embodiments of the present disclosure.

To provide additional details for an improved understanding of the benefits of using RTZ-encoded RX signals, reference is now made to FIG. 7 which illustrates a plurality of receive signal waveforms 700 for a 10BASE-T1S PHY wherein RTZ pulse encoding/decoding is applied to the receive pin data when the RX driver in the transceiver has a large asymmetry between the rising and falling edge in accordance with selected embodiments of the present disclosure. As illustrated, the MDI bus signal 701 depicts the DME-encoded signal received at the MDI bus 503. In addition, the comparator output signal 702 depicts the output of the receiving comparator 522 which is driven "high" (when the MDI bus voltage is above 0 V) and "low" (when the MDI bus voltage is below 0 V). And as shown with the RTZ-encoded RX signal 703, the pulse encoder 524 responds to each transition on the comparator output signal 702 by generating a positive pulse on the RX signal 703 having a fixed width or duration of $t_{WRX}$. However, in this example, the RX driver 525 in the transceiver 520 has a large asymmetry between the slower rising edge and faster falling edge. But due to the processing of the received RX signal 703 with the RX input circuitry 517 and decoding with the pulse decoder 516, there is no asymmetry in the generated DME-encoded PMA input signal 704 since the data is only transported on the rising edge of RX signal. In this example, it was only the asymmetry of the RX driver 525, but also the asymmetry of the RX input circuit 517 in the MCU/Switch 510 will not have an impact on the PMA input data signal 704. This is also valid for any asymmetry added between the transceiver 520 and integrated digital PHY 511, such as, for example, an isolator circuitry inserted between the transceiver 520 and MCU/Switch 510.

Figure 8:
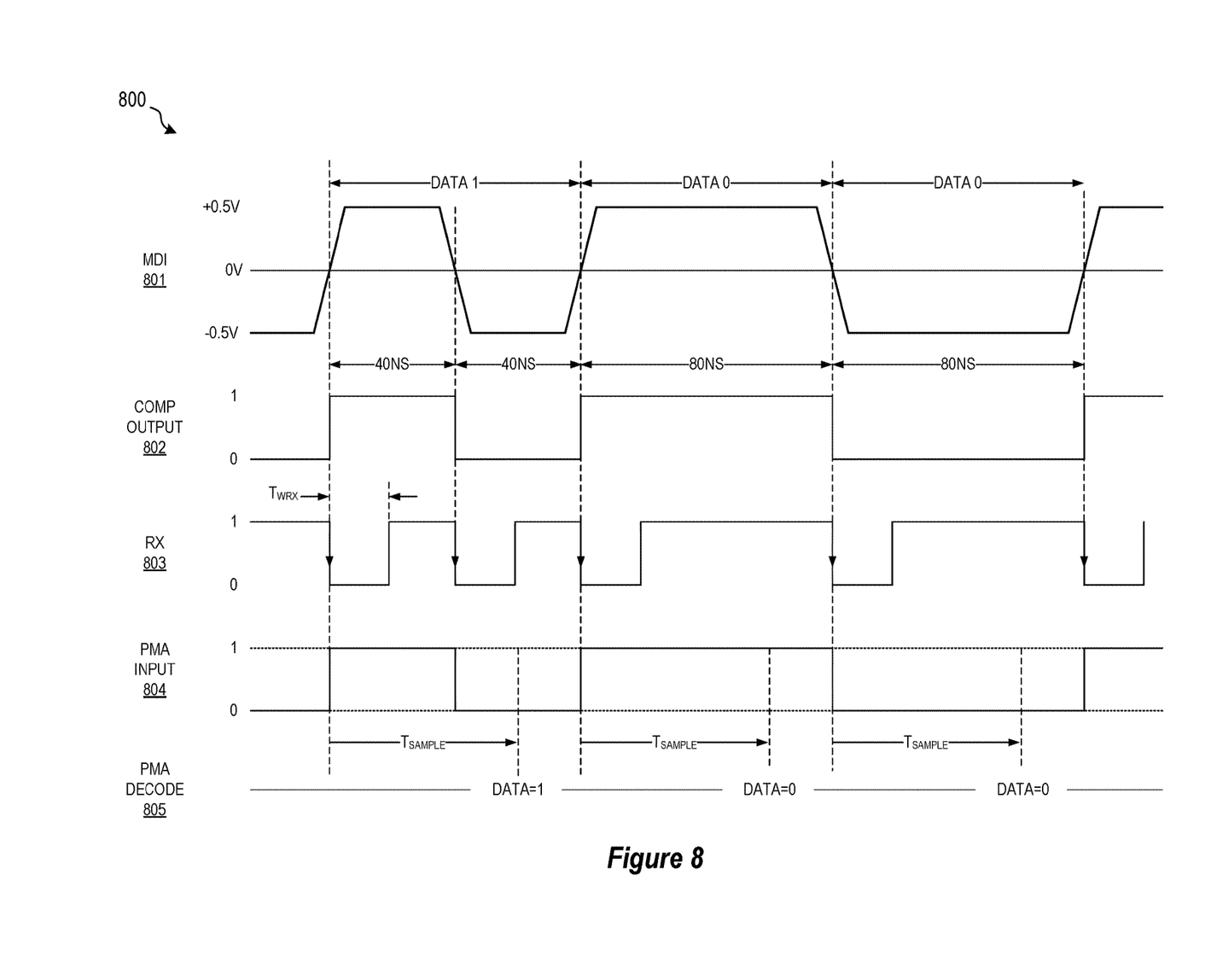
FIG. 8 illustrates a plurality of receive signal waveforms for a 10BASE-T1S PHY wherein negative pulse encoding/decoding is applied to the receive pin data accordance with selected embodiments of the present disclosure.

For an improved understanding of selected embodiments of the present disclosure, reference is now made to FIG. 8 which illustrates a plurality of receive signal waveforms 800 for a 10BASE-T1S PHY wherein negative pulse encoding/decoding is applied to the receive pin data. As illustrated, the MDI bus signal 801 depicts the DME-encoded signal received at the MDI bus 503, and the comparator output signal 802 depicts the output of the receiving comparator 522 which is driven "high" (when the MDI bus voltage is above 0 V) and "low" (when the MDI bus voltage is below 0 V). However, rather than generating positive pulses at the RX pin, the pulse encoder 502 generates negative pulses to transfer information on the negative or falling edge of the RX signal 803. Thus, the pulse encoder 524 generates a pulse encoded RX signal 803 that responds to each transition on the comparator output signal 802 by generating a negative pulse on the RX signal 803 having a fixed width or duration of $t_{WRX}$. After processing of the received RX signal 803 with the RX input circuitry 517, the pulse decoder 516 may be configured to generate the DME-encoded PMA input signal 804 by generating PMA input pulse transitions at each falling transition of the received RX signal 803, thereby eliminating any asymmetry in the generated DME-encoded PMA input signal 804.

As disclosed here, the advantages of using pulse encoding/decoding on the RX pin is that any asymmetry added by the RX driver 525 and/or the RX input circuit 517 will not reduce the timing budget for the PMA sampling, thereby allowing other effects that determine the jitter to be larger so that the communication network is more robust network. Another advantage of using pulse encoding/decoding on the RX pin is that the PMA unit can be implemented without requiring more complex or expensive designs, such as requiring fast input pins on an MCU. In addition, the use of pulse encoding/decoding on the RX pin removes the requirement that the RX driver 525 have symmetric rising and falling transitions or edges, and the use of slower slopes will improve EME performance of the transceiver. This is a significant advantage since fast slopes on logic pin drivers will result in ground noise that can be visible in the on the bus due to the shared ground pin in the transceiver.

Figure 9:
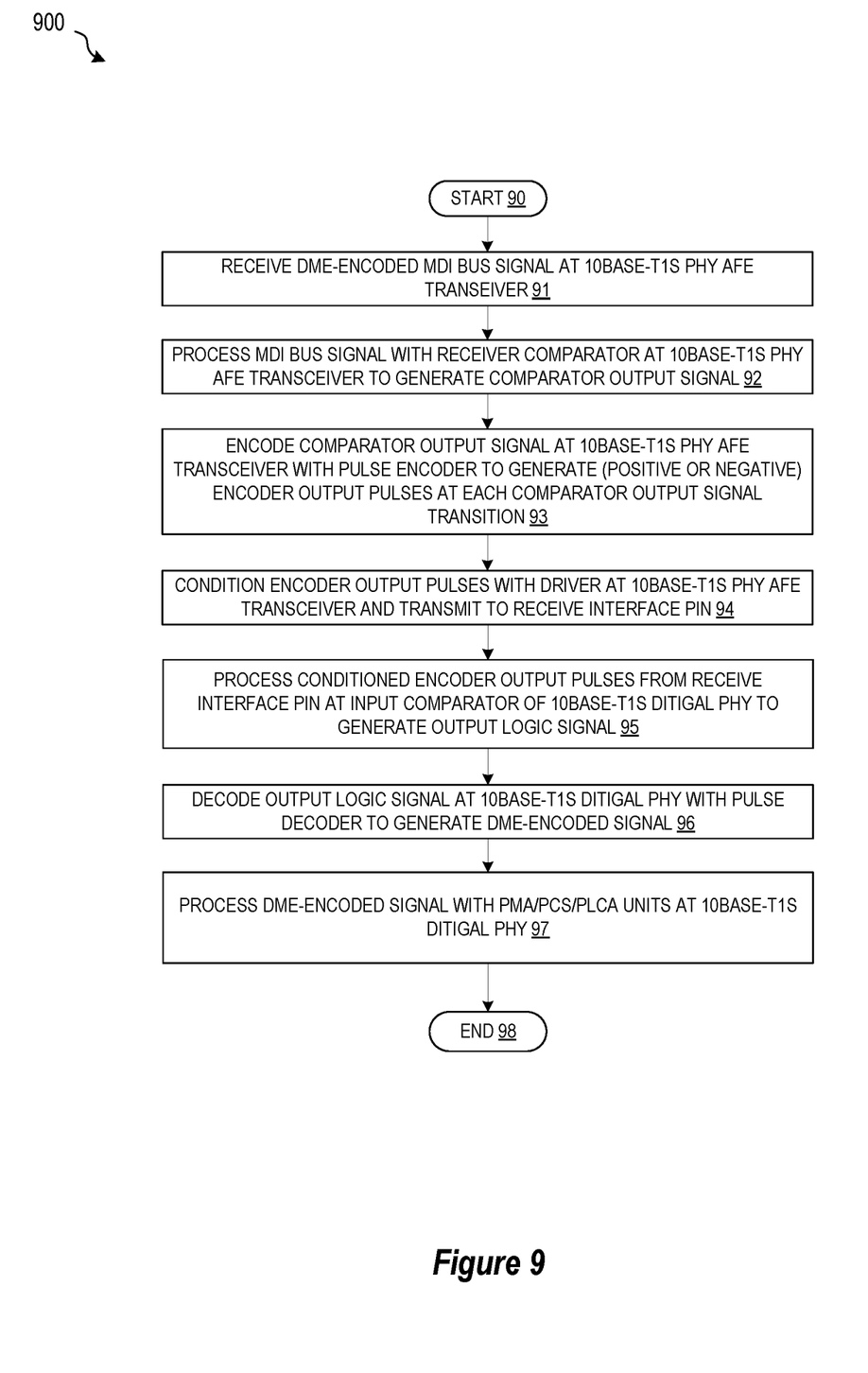
FIG. 9 illustrates a simplified flowchart showing the logic for controlling the operation of data reception at a 10BASE-T1S PHY in accordance with the selected embodiments of the present disclosure.

Turning now to FIG. 9, there is shown a simplified flowchart diagram 900 showing the logic for controlling the operation of data reception at a 10BASE-T1S PHY in accordance with the selected embodiments of the present disclosure. When the data reception operations of the 10BASE-T1S PHY starts (90), the analog front end (AFE) transceiver portion of the 10BASE-T1S PHY receives a DME-encoded MDI bus signal as an input analog signal on a single unshielded twisted pair (UTP) cable (step 91). Next, the MDI bus signal is processed with a receiver comparator in the 10BASE-T1S PHY AFE transceiver, thereby generating a comparator output signal (step 92). At step 93, the comparator output signal is encoded at the 10BASE-T1S PHY AFE transceiver by using a pulse encoder which generates positive or negative encoder output pulses at each transition or edge of the comparator output signal. In selected embodiments, the encoding at step 93 may employ a return-to-zero (RTZ) coding scheme where each rising or falling transition in the comparator output signal generates a positive pulse having a specified duration ($t_{WRX}$). In other embodiments, the encoding at step 93 may employ a return-to-one (RTO) coding scheme where each rising or falling transition in the comparator output signal generates a negative pulse. At step 94, the pulse encoder output pulses may be conditioned with an output driver at the 10BASE-T1S PHY AFE transceiver which is connected to transmit the conditioned pulse encoder output pulses to the receive interface pin RX. At step 95, the conditioned pulse encoder output pulses are received from the receive interface pin RX and processed at an input comparator in the 10BASE-T1S digital PHY, thereby generating an output logic signal. At step 96, the output logic signal from the input comparator is decoded at the 10BASE-T1S digital PHY by using a pulse decoder to generate a DME-encoded signal which is then processed at the 10BASE-T1S digital PHY with the PMA unit, PCS unit, and PLCA unit (step 97), after with receive processing ends (step 98).

By now it should be appreciated that there is provided herein a method and apparatus for receiving data at an Ethernet PHY from a medium dependent interface (MDI) bus which may be implemented with a single unshielded twisted pair (UTP) cable. In selected embodiments, the Ethernet PHY may be a 10BASE-T1S PHY defined by the IEEE 802.3cg standard. In the disclosed methodology and apparatus, the Ethernet PHY receives an analog signal from the MDI bus that conveys data encoded using differential Manchester encoding (DME). In addition, the Ethernet PHY processes the analog signal using a receiver comparator to generate a digital output signal with DME-encoded data. The Ethernet PHY also processes the digital output signal using a pulse encoder to generate a pulse-coded output signal which includes a pulse generated at each rising or falling transition in the digital output signal. In selected embodiments, the pulse-coded output signal is generated with a positive pulse at each rising or falling transition in the digital output signal. In other embodiments, the pulse-coded output signal is generated with a negative pulse at each rising or falling transition in the digital output signal. In addition, the Ethernet PHY processes the pulse-coded output signal with an output driver to generate a pulse-coded driver output signal that is transmitted to a receiver interface pin RX. The Ethernet PHY also processes the pulse-coded driver output signal with an input comparator that is connected to the receiver interface pin RX and configured to generate a pulse-coded comparator output signal. The Ethernet PHY also processes the pulse-coded comparator output signal using a pulse decoder to generate a DME-encoded Physical Medium Attachment (PMA) input signal in which timing asymmetries caused by processing at the output driver and/or input comparator have been eliminated. Finally, the Ethernet PHY processes the DME-encoded Physical Medium Attachment (PMA) input signal at a digital PHY circuit which may include a PMA unit, PCS unit, and PLCA unit. In selected embodiments, the duration or width of each pulse in the pulse-coded output signal ($t_{WRX}$) is controlled to have a predetermined minimum duration (that is sufficient for the output driver and input comparator to detect the pulses) and a predetermined maximum duration (that is sufficient to ensure that the pulse is over before the next possible transition on the MDI bus and comparator output). In other embodiments, the receiver comparator, pulse encoder, and output driver may be integrated on a first analog front end transceiver integrated circuit chip. In addition or in the alternative, the input comparator, pulse decoder, and digital PHY circuit may be integrated on a second microcontroller or Ethernet switch integrated circuit chip.

In another form, there is provided an Ethernet PHY and associated method of operation adapted to receive data over a twisted pair of conductors for short reach applications having a bandwidth of 10 Mbit/s. In selected embodiments, the twisted pair of conductors is a medium dependent interface (MDI) bus formed with a single unshielded twisted pair (UTP) cable. In addition, the Ethernet PHY may be implemented as a 10BASE-T1S PHY defined by the IEEE 802.3cg standard. In the disclosed Ethernet PHY, a receiver comparator having first and second inputs is connected to the twisted pair of conductors to receive an analog signal that conveys data encoded using differential Manchester encoding (DME), where the receiver comparator processes the analog signal to generate a digital output signal with DME-encoded data. In addition, the disclosed Ethernet PHY includes a pulse encoder that is connected and configured to process the digital output signal and to generate a pulse-coded output signal in which a pulse is generated at each rising or falling transition in the digital output signal. In selected embodiments, the pulse encoder is configured to generate the pulse-coded output signal with a positive pulse or a negative pulse at each rising or falling transition in the digital output signal. In other embodiments, the pulse encoder may be configured to employ a return-to-zero (RTZ) coding scheme or a return-to-one (RTO) coding scheme when generating the pulse-coded output signal. The disclosed Ethernet PHY also includes a driver that is connected and configured to process the pulse-coded output signal and to generate a pulse-coded driver output signal. In addition, the disclosed Ethernet PHY includes a comparator that is connected and configured to process the pulse-coded driver output signal and to generate a pulse-coded comparator output signal. In addition, the disclosed Ethernet PHY includes a pulse decoder that is connected and configured to process the pulse-coded comparator output signal and to generate a DME-encoded Physical Medium Attachment (PMA) input signal in which timing asymmetries caused by processing at the driver and/or comparator have been eliminated. In selected embodiments, each pulse in the pulse-coded output signal may have a predetermined minimum duration that is sufficient for the output driver and input comparator to detect the pulses, and may also have a predetermined maximum duration that is sufficient to ensure that the pulse is over before the next possible transition on the MDI bus and comparator output. In addition, the disclosed Ethernet PHY includes a digital PHY circuit that is connected and configured to process the processing the DME-encoded PMA input signal and to generate data to be send over a Media-Independent Interface (MII) to a Media Access Control (MAC) device. In selected embodiments, a receiver interface pin RX connects an output from the driver to an input of the comparator, where the driver is an output driver formed on a first integrated circuit chip with the receiver comparator and pulse encoder, and where the comparator is an input driver formed on a second integrated circuit chip with the comparator and pulse decoder. In other embodiments, the receiver comparator, pulse encoder and driver are configured to convert signal levels on the twisted pair of conductors to a return-to-zero (RTZ) encoded signal at an output of the driver that is connected to a receive interface pin RX.

In yet another form, there is provided an Ethernet PHY communication system formed with one or more circuits or processors to receive data over a twisted pair of conductors for short reach applications having a bandwidth of 10 Mbit/s. As formed, the one or more circuits and/or processors are operable to receive, from a medium dependent interface (MDI) bus formed with a single unshielded twisted pair (UTP) cable, an analog signal that conveys differential Manchester encoded (DME) data. In addition, the one or more circuits and/or processors are operable to process the analog signal using a receiving comparator to generate a DME-encoded digital output signal; to employ a return-tozero (RTZ) coding scheme or a return-to-one (RTO) coding scheme to encode the DME-encoded digital output signal to generate a pulse-coded output signal comprising a pulse generated at each rising or falling transition in the DME-encoded digital output signal; and to process the pulse-coded output signal with a driver to generate a pulse-coded driver output signal that is transmitted by the driver to a receiver interface pin RX. The one or more circuits and/or processors are also operable to process the pulse-coded driver output signal that is received from the receiver interface pin RX with a comparator that is connected to generate a pulse-coded comparator output signal; to decode the pulse-coded comparator output signal to generate a DME-encoded Physical Medium Attachment (PMA) input signal in which timing asymmetries caused by processing at the driver and/or comparator have been eliminated; and to transmit the DME-encoded Physical Medium Attachment (PMA) input signal to a digital PHY circuit. In selected embodiments, the Ethernet PHY communication system is a 10BASE-T1S PHY defined by the IEEE 802.3cg standard formed with first and second integrated circuits, where the first integrated circuit comprises a pulse encoder which encodes the DME-encoded digital output signal to generate the pulse-coded output signal comparator, and where the second integrated circuit comprises a pulse decoder which decodes the pulse-coded comparator output signal to generate the DME-encoded PMA input signal.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified block diagrams and flow charts illustrating design and operational details of a 10BASE-T1S PHY system without including every device feature or aspect in order to avoid limiting or obscuring the present invention. Such descriptions and representations are used by those skilled in the art to describe and convey the substance of their work to others skilled in the art, and the omitted details which are well known are not considered necessary to teach one skilled in the art of how to make or use the present invention. Some portions of the detailed descriptions provided herein are also presented in terms of algorithms and instructions that operate on data that is stored in a computer memory. In general, an algorithm refers to a self-consistent sequence of steps leading to a desired result, where a "step" refers to a manipulation of physical quantities which may, though need not necessarily, take the form of electrical or magnetic signals capable of being stored, transferred, combined, compared, and otherwise manipulated. It is common usage to refer to these signals as bits, values, elements, symbols, characters, terms, numbers, or the like. These and similar terms may be associated with the appropriate physical quantities and are merely convenient labels applied to these quantities. Unless specifically stated otherwise as apparent from the following discussion, it is appreciated that, throughout the description, discussions using terms such as "processing" or "computing" or "calculating" or "determining" or "displaying" or the like, refer to the action and processes of hardware or a computer system or a similar electronic computing device, that manipulates and transforms data represented as physical (electronic) quantities within registers and memories into other data similarly represented as physical quantities within the memories or registers or other such information storage, transmission or display devices.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as "computer systems."

However, other modifications, variations and alternatives are also possible. The specifications and drawings are, accordingly, to be regarded in an illustrative rather than in a restrictive sense.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. In addition, the term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for receiving data at an Ethernet PHY from a medium dependent interface (MDI) bus, comprising:
receiving an analog signal from the MDI bus that conveys data encoded using differential Manchester encoding (DME);
processing the analog signal using a receiver comparator at the Ethernet PHY to generate a digital output signal with DME-encoded data;
processing the digital output signal using a pulse encoder at the Ethernet PHY to generate a pulse-coded output signal comprising a pulse generated at each rising or falling transition in the digital output signal;
processing the pulse-coded output signal with an output driver at the Ethernet PHY that is connected to the receiver interface pin RX and configured to generate a pulse-coded driver output signal that is transmitted to a receiver interface pin RX;
processing the pulse-coded driver output signal with an input comparator at the Ethernet PHY that is connected to generate a pulse-coded comparator output signal;
processing the pulse-coded comparator output signal using a pulse decoder at the Ethernet PHY to generate a DME-encoded Physical Medium Attachment (PMA) input signal in which timing asymmetries caused by processing at the output driver and/or input comparator have been eliminated; and
processing the DME-encoded Physical Medium Attachment (PMA) input signal at a digital PHY circuit in the Ethernet PHY.

2. The method of claim 1, where the MDI bus comprises a single unshielded twisted pair (UTP) cable.

3. The method of claim 1, where the Ethernet PHY comprises a 10BASE-T1S PHY defined by the IEEE 802.3cg standard.

4. The method of claim 1, where the receiver comparator, pulse encoder, and output driver are integrated on a first analog front end transceiver integrated circuit chip.

5. The method of claim 1, where the input comparator, pulse decoder, and digital PHY circuit are integrated on a first microcontroller or Ethernet switch integrated circuit chip.

6. The method of claim 1, where processing the pulse-coded output signal comprises generating a positive pulse at each rising or falling transition in the digital output signal.

7. The method of claim 1, where processing the pulse-coded output signal comprises generating a negative pulse at each rising or falling transition in the digital output signal.

8. The method of claim 1, where each pulse in the pulse-coded output signal has a predetermined minimum duration that is sufficient for the output driver and input comparator to detect the pulses, and has a predetermined maximum duration that is sufficient to ensure that the pulse is over before the next possible transition on the MDI bus and comparator output.

9. An Ethernet PHY adapted to receive data over a twisted pair of conductors for short reach applications having a bandwidth of 10 Mbit/s, comprising:
a receiver comparator having first and second inputs connected to the twisted pair of conductors to receive an analog signal that conveys data encoded using differential Manchester encoding (DME), where the receiver comparator processes the analog signal to generate a digital output signal with DME-encoded data;
a pulse encoder connected to process the digital output signal to generate a pulse-coded output signal comprising a pulse generated at each rising or falling transition in the digital output signal;
a driver connected to process the pulse-coded output signal and to generate a pulse-coded driver output signal;
a comparator connected to process the pulse-coded driver output signal and to generate a pulse-coded comparator output signal;
a pulse decoder connected to process the pulse-coded comparator output signal and to generate a DME-encoded Physical Medium Attachment (PMA) input signal in which timing asymmetries caused by processing at the driver and/or comparator have been eliminated; and
a digital PHY circuit connected to process the processing the DME-encoded PMA input signal and to generate data to be send over a Media-Independent Interface (MII) to a Media Access Control (MAC) device.

10. The Ethernet PHY of claim 9, where a receiver interface pin RX connects an output from the driver to an input of the comparator, where the driver is an output driver formed on a first integrated circuit chip with the receiver comparator and pulse encoder, and where the comparator is an input driver formed on a second integrated circuit chip with the comparator and pulse decoder.

11. The Ethernet PHY of claim 9, where the twisted pair of conductors comprises a medium dependent interface (MDI) bus formed with a single unshielded twisted pair (UTP) cable.

12. The Ethernet PHY of claim 9, where the Ethernet PHY comprises a 10BASE-T1S PHY defined by the IEEE 802.3cg standard.

13. The Ethernet PHY of claim 9, where the pulse encoder is configured to generate the pulse-coded output signal with a positive pulse at each rising or falling transition in the digital output signal.

14. The Ethernet PHY of claim 9, where the pulse encoder is configured to generate the pulse-coded output signal with a negative pulse at each rising or falling transition in the digital output signal.

15. The Ethernet PHY of claim 9, where each pulse in the pulse-coded output signal has a predetermined minimum duration that is sufficient for the output driver and input comparator to detect the pulses, and has a predetermined maximum duration that is sufficient to ensure that the pulse is over before the next possible transition on the MDI bus and comparator output.

16. The Ethernet PHY of claim 9, where the receiver comparator, pulse encoder and driver are configured to convert signal levels on the twisted pair of conductors to a return-to-zero (RTZ) encoded signal at an output of the driver that is connected to a receive interface pin RX.

17. The Ethernet PHY of claim 9, where the pulse encoder is configured to employ a return-to-zero (RTZ) coding scheme when generating the pulse-coded output signal.

18. The Ethernet PHY of claim 9, where the pulse encoder is configured to employ a return-to-one (RTO) coding scheme when generating the pulse-coded output signal.

19. An Ethernet PHY communication system comprising one or more circuits and/or processors being operable to:
receive, from a medium dependent interface (MDI) bus formed with a single unshielded twisted pair (UTP) cable, an analog signal that conveys differential Manchester encoded (DME) data;
process the analog signal using a receiving comparator to generate a DME-encoded digital output signal;
employ a return-to-zero (RTZ) coding scheme or a return-to-one (RTO) coding scheme to encode the DME-encoded digital output signal to generate a pulse-coded output signal comprising a pulse generated at each rising or falling transition in the DME-encoded digital output signal;
process the pulse-coded output signal with a driver to generate a pulse-coded driver output signal that is transmitted by the driver to a receiver interface pin RX;
process the pulse-coded driver output signal that is received from the receiver interface pin RX with a comparator that is connected to generate a pulse-coded comparator output signal;
decode the pulse-coded comparator output signal to generate a DME-encoded Physical Medium Attachment (PMA) input signal in which timing asymmetries caused by processing at the driver and/or comparator have been eliminated; and
transmit the DME-encoded Physical Medium Attachment (PMA) input signal to a digital PHY circuit.

20. The Ethernet PHY communication system of claim 19, where Ethernet PHY comprises a 10BASE-T1S PHY defined by the IEEE 802.3cg standard formed with first and second integrated circuits, where the first integrated circuit comprises a pulse encoder which encodes the DME-encoded digital output signal to generate the pulse-coded output signal comparator, and where the second integrated circuit comprises a pulse decoder which decodes the pulse-coded comparator output signal to generate the DME-encoded PMA input signal.

* * * * *